United States Patent [19]

Abdi

[11] Patent Number: 4,868,423
[45] Date of Patent: Sep. 19, 1989

[54] CURRENT MODE LOGIC GATE
[75] Inventor: Behrooz L. Abdi, Chandler, Ariz.
[73] Assignee: Motorola, Inc., Schaumburg, Ill.
[21] Appl. No.: 188,941
[22] Filed: May 2, 1988
[51] Int. Cl.[4] .................. H03K 17/16; H03K 19/086; H03K 5/12
[52] U.S. Cl. .................................. 307/455; 307/443; 307/445; 307/263
[58] Field of Search ................. 307/443, 455, 445, 263

[56] References Cited
FOREIGN PATENT DOCUMENTS
0176908 4/1986 European Pat. Off. ............ 307/455

Primary Examiner—Stanley D. Miller
Assistant Examiner—Margaret Rose Wambach
Attorney, Agent, or Firm—Mike Bingham

[57] ABSTRACT

A current mode logic gate for logically combining input logic signals is comprised of a first pair of transistors each having a base, collector and at least one emitter with the emitters being coupled together to a current source while the bases are respectively coupled to first and second inputs of the gate. At least one other pair of transistors are provided the bases of which are coupled to third and fourth inputs of the gate while the collectors are respectively coupled to first and second outputs of the gate. Each of the transistors of the other pair have first and second emitters with the first emitters being coupled to the collector of one of the transistors of the first pair of transistors while the second emitter of one of the transistors of the other pair is coupled to the collector of the other one of the first pair of transistors. The second emitter of the other one of the other pair of transistors is either left open-circuited or is shorted to its base. The collectors of the other pair of transistors are respectively coupled to first and second outputs of the gate.

6 Claims, 1 Drawing Sheet

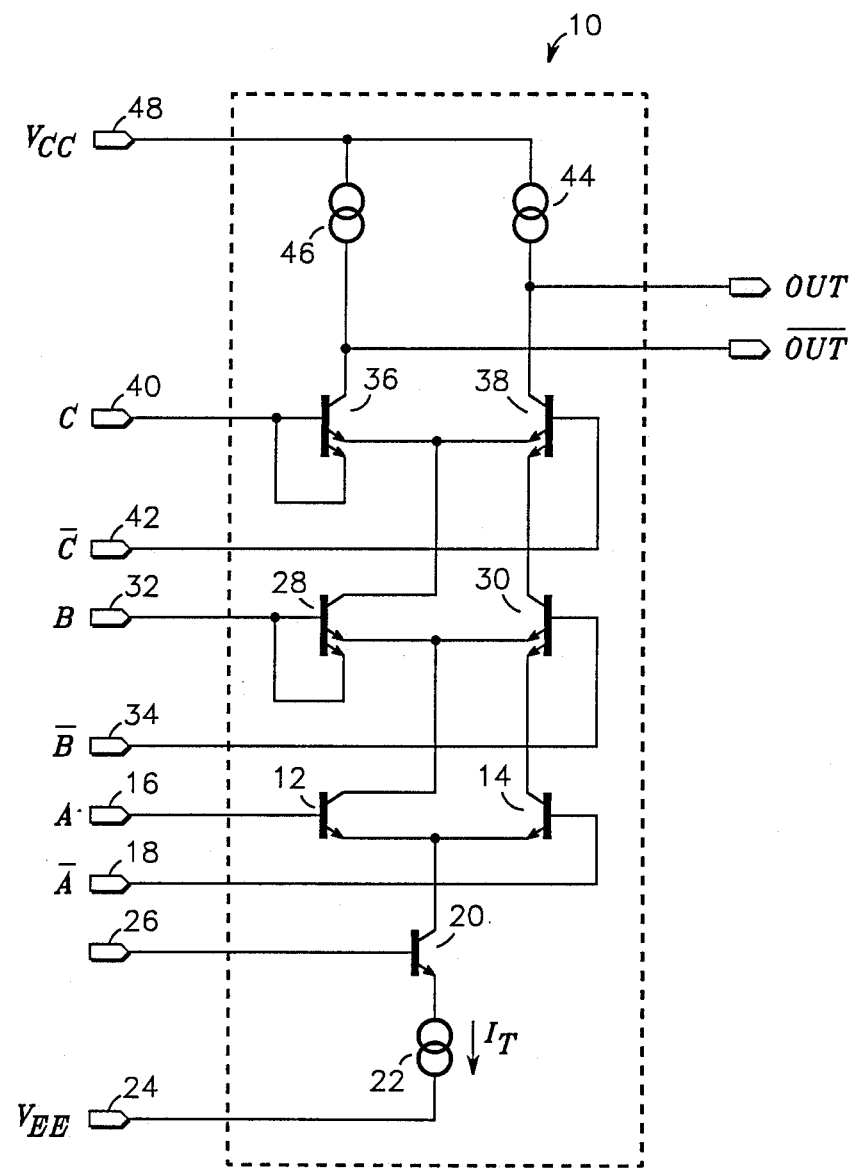

CURRENT MODE LOGIC GATE

BACKGROUND OF THE INVENTION

The present invention relates to logic gates and, more particularly, to current mode or differential logic gates.

Current mode logic gates are well known in the art. In these types of gates a "tail" current is switched between differential circuit paths to provide complementary output signals in response to a particular coded logic input signals applied to the gate. Although prior art CML gates typically function at lower speeds, many, if not all, suffer problems in high speed circuit applications where matched output signal rise/fall times and input loading effects become critical.

For example, one common prior art CML gate uses a "multiplier" approach to steer the tail current to load resistors for various logic functions. In this approach, the two load resistors are connected to unequal numbers of transistor collectors, typically, for a three input gate, one load resistor may be connected to seven collectors while the other is connected to only one collector. Hence, the first output has more capacitance loading than the other such that the output switches at a slower rate than the latter in response to the logic input signal. This load to collector connection ratio varies for different logic gates (AND, OR, etc.) making propagation delays gate dependent. Further, another disadvantage of this type of gate is that the logic input signals are loaded by an unequal number of transistors which results in code dependency of the response delays. In a system where several signals are processed in a parallel fashion, unequal rise/fall time delays and their dependency on the logic function and the code causes undesirable timing differences between the different signals.

Hence, a need exist for a high speed CML gate in which the switched tail current paths are matched and in which the output capacitance loading is reduced and matched to provide matched rise/fall gate delays at the output of the gate thus making propagation delays both function and code independent.

SUMMARY OF THE INVENTION

Accordingly, it is an object of the present invention to provide an improved logic gate.

Another object of the present invention is to provide an improved CML gate.

In accordance with the above and other objects there is provided a logic gate comprising a first pair of transistors the emitters of which are coupled together for receiving complementary logic inputs signals at the respective bases thereof, a tail current supply coupled to the emitters of the first pair of transistors for sinking a predetermined current, at least a second pair of transistors each having a pair of emitters, a base and a collector with the bases suited to receive a second pair of complementary logic input signals and whose collectors are coupled to respective outputs of the gate while the first pair of emitters of each of second pair of transistors are coupled to the collector of a first one of the transistors of the first pair and the second one of the pair of emitters of the first one of the second pair of transistors is coupled to the collector of the second one of the first pair of transistors with the second emitter of the second transistor of the second pair of transistors being either open or short circuit to its base.

It is one aspect of the invention that a different combination of connections from emitter pairs of the second pair of transistors to collectors of the first pair result in a different logic function gate.

BRIEF DESCRIPTION OF THE DRAWINGS

The sole FIGURE is a schematic diagram illustrating the CML gate of the preferred embodiment

DETAILED DESCRIPTION OF THE PREFERRED EMBODIMENT

Turning to the sole Figure there is illustrated CML gate 10 of the present invention. It is understood that gate 10 is suited to be manufactured in integrated circuit (IC) form. A first pair of transistors 12 and 4 have there bases coupled respectively to inputs 16 and 18 to which are applied complementary logic input signals A and $\overline{A}$ while the emitters of the two transistors are interconnected to the collector of transistor 20. The emitter of transistor 20 is coupled via current source 22 to terminal 24 to which is supplied a negative or reference potential $V_{EE}$. The base of transistor 20 is coupled to terminal 26 at which is received a bias control signal. Transistor 20 and current source 22 (which may be realized by a resistor or a diode, for example) function as a current supply means for supplying tail current $I_T$.

In general, CML gate 10 comprises a plurality of double emitter transistor pairs coupled between $V_{CC}$ and the collectors of transistors 12 and 14 although only one such transistor pair is required to logically combine a pair of input logic signals. CML gate 10 therefore logically combines multiple logic input signals in different logic functions depending upon the connection of the double emitters of the double emitter transistor pairs as will be described By way of example, CML gate 10 is illustrated as being connected to provide a logic AND function wherein all of logic input signals A, B and C must be a logic one to produce a logic one at output 50. In this configuration the first emitters of transistor pair 28 and 30 are coupled to the collector of transistor 12 while the second emitter of transistor 30 is coupled to the collector of transistor 14. The second emitter of transistor 28 is shown as being shorted to its base, however, it is understood that the emitter could just as well be open-circuited and will not affect the circuit operation. The bases of transistors 28 and 30 receive a second complementary logic input signal $(B, \overline{B})$ supplied to inputs 32 and 34. Similarly, the first emitters of double emitter transistors 36 and 38 are coupled to the collector of transistor 28 while the second emitter of transistor 38 is coupled to the collector of transistor 30 and the second emitter of transistor 36 is either open-circuited or shorted to its base. A third complementary logic input signal $(C, \overline{C})$ is supplied to the bases of transistors 36 and 38 through inputs 40 and 42. The collectors of transistors 36 and 38 are coupled to terminal 48 via a pair of respective current sources 46 and 44 which may be realized by a pair of resistors. Complementary logic output signals are supplied at outputs 50 and 52 which are coupled to the collectors of transistors 38 and 36 respectively. It is understood that by connecting the second emitters of transistors 28 and 36 to the collectors of transistors 14 and 30 respectively while open circuiting the second emitters of transistors 30 and 38 will cause CML gate 10 to function as an OR gate. In operation, if the A and $\overline{A}$ inputs are a logic zero and one respectively, the output signals at outputs 50 and 52 will be a logic zero and one regardless of the logic code of signals B and C. This is true since IT will be forced through the collector-emitter conduction paths of transistors 30 and 38 as transistor 14 is turned on. However, if logic input A is high (a logic one) then $I_T$ is switched or steered through transistor 12 and, depending on the inputs B and C, will flow through one or the other of transistors 28; 30 or 36; 38. For example, if B and C are high, $I_T$ will be steered through transistors 28 and 36. Hence, the logic output signal appearing at output 50, OUT, will be in a logic one state while the output logic signal $\overline{\text{out}}$ appearing at output 52 will be a logic zero. For any other logic input codes OUT will be a logic zero. Thus, CML gate 10 logically combines the three input logic codes in an AND logic function according to the following truth table:

| Inputs | | | Output |
|---|---|---|---|
| A | B | C | Terminal 50 |
| 0 | 0 | 0 | 0 |
| 0 | 1 | 0 | 0 |
| 0 | 0 | 1 | 0 |
| 0 | 1 | 1 | 0 |
| 1 | 0 | 0 | 0 |
| 1 | 1 | 0 | 0 |
| 1 | 0 | 1 | 0 |
| 1 | 1 | 1 | 1 |

Again, by interchanging the connections of the second emitters of transistors 28; 30 and 36; 38 the logic function of CML gate 10 be changed from an AND to a OR logic gate.

Hence, what has been described above is a novel CML gate having reduced output capacitance loading due to a reduction in the number of collectors coupled to the outputs of the gate to provide a predetermined logic function Further, the path that the tail current flows through to the output is the same regardless of the input signal, or the type of logic gate while the inputs have the same amount of loading. Thus, the speed of the CML gate is increased and the rise/fall times of the output signals are decreased and become equal.

What is claimed is:

1. A circuit, comprising:
a first pair of transistors each having a base, collector and at least one emitter, said emitters being coupled together;
means for coupling said bases of said first pair of transistors to first and second inputs of the circuit respectively;
at least a second pair of transistors each having a base, a collector, a first and a second emitter, said first emitters being coupled together to said collector of a first one of said first pair of transistors, said second emitter of one of said second pair of transistors being coupled to said collector of the second one of said first pair of transistors, second said emitter of the other one of said second pair of transistors being either open-circuited or shorted to said base thereof;
means for coupling said bases of said second pair of transistors to third and fourth inputs of the circuit respectively;
means for coupling said collectors of said second pair of transistors to first and second outputs respectively of the circuit; and
current supply means coupled to said emitters of said first pair of transistors for conducting current.

2. The circuit of claim 1 wherein said means for coupling said collectors of said second pair of transistors to said first and said second outputs includes:
a third pair of transistors each having a base, a collector and first and second emitters, said first emitters being coupled together to said collector of a first one of said second pair of transistors, said second emitter of one of said third pair of transistors being coupled to said collector of the second one of said second pair of transistors, said second emitter of the other one of said third pair of transistors being either open-circuited or shorted to the base thereof;
means for coupling said bases of said third pair of transistors to fifth and sixth inputs of the circuit respectively; and
means for coupling said collectors of said third pair of transistors to said first and second outputs of the circuit respectively 3. A current mode logic gate, comprising:
a first pair of transistors each having a base, collector and at least one emitter, said emitters being coupled together;
means for coupling said bases of said first pair of transistors to first and second inputs of the circuit respectively;
at least a second pair of transistors each having a base, a collector, a first and a second emitter, said first emitters being coupled together to said collector of a first one of said first pair of transistors, said second emitter of one of said second pair of transistors being coupled to said collector of the second one of said first pair of transistors, second said emitter of the other one of said second pair of transistors being either open-circuited or shorted to said base thereof;
means for coupling said bases of said second pair of transistors to third and fourth inputs of the circuit respectively;
means for coupling said collectors of said second pair of transistors to first and second outputs respectively of the circuit; and
current supply means coupled to said emitters of said first pair of transistors for conducting a substantially constant current.

4. The gate of claim 3 wherein said means for coupling said collectors of said second pair of transistors to said first and said second outputs includes:
a third pair of transistors each having a base, a collector and first and second emitters, said first emitters being coupled together to said collector of a first one of said second pair of transistors, said second emitter of one of said third pair of transistors being coupled to said collector of the second one of said second pair of transistors, said second emitter of the other one of said third pair of transistors being either open-circuited or shorted to the base thereof;
means for coupling said bases of said third pair of transistors to fifth and sixth inputs of the circuit respectively; and
means for coupling said collectors of said third pair of transistors to said first and second outputs of the circuit respectively.

5. An integrated current mode logic gate, comprising:
a first pair of transistors each having a base, collector and at least one emitter, said emitters being coupled together;

means for coupling said bases of said first pair of transistors to first and second inputs of the gate respectively;

a second pair of transistors each having a base, a collector, first and second emitters, said first emitters being coupled to said collector of a first one of said transistors of said first pair of transistors, said second emitter of a first one of said second pair of transistors being coupled to said collector of second one of said first pair of transistors, said second emitter of the second one of said second pair of transistors being either open-circuited or shorted to the base thereof, said collector of said first transistor of said second pair of transistors being coupled to a first output of the gate, said collector of said second transistor being coupled to a second output of the gate;

means for coupling said bases of said second pair of transistors to third and fourth inputs of the gate; and a current supply coupled to said emitters of said first pair of transistors 6. The gate of claim 5 wherein said means for coupling said collectors of said second pair of transistors to said first and said second outputs includes:

a third pair of transistors each having a base, collector, first and second emitters, said first emitters being coupled to said collector of said second transistor of said second pair of transistors, said second emitter of a first one of said third pair of transistors being coupled to said collector of said first transistor of said second pair of transistors, said second emitter of the second one of said third pair of transistors being either open-circuited or shorted to said base thereof, said collectors of said first and second transistors being coupled respectively to said first and said second outputs; and means for coupling said bases of said third pair of transistors to fifth and sixth inputs of the gate respectively.

* * * * *